(12) United States Patent
Zhu et al.

(10) Patent No.: US 12,191,260 B2
(45) Date of Patent: Jan. 7, 2025

(54) DISPLAY PANEL AND DISPLAY APPARATUS

(71) Applicant: Xiamen Tianma Display Technology Co., Ltd., Xiamen (CN)

(72) Inventors: Yihua Zhu, Xiamen (CN); Qingjun Lai, Xiamen (CN); Jinjin Yang, Xiamen (CN); Jiaxian Liu, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 443 days.

(21) Appl. No.: 17/723,524

(22) Filed: Apr. 19, 2022

(65) Prior Publication Data

US 2023/0215814 A1    Jul. 6, 2023

(30) Foreign Application Priority Data

Dec. 30, 2021 (CN) .......................... 202111659646.7

(51) Int. Cl.
| | |
|---|---|
| *H01L 23/552* | (2006.01) |
| *H01L 27/12* | (2006.01) |
| *H10K 59/121* | (2023.01) |
| *H10K 59/126* | (2023.01) |
| *H10K 59/131* | (2023.01) |

(52) U.S. Cl.
CPC .......... *H01L 23/552* (2013.01); *H01L 27/124* (2013.01); *H10K 59/1213* (2023.02); *H10K 59/126* (2023.02); *H10K 59/131* (2023.02)

(58) Field of Classification Search
CPC . H01L 23/552; H01L 27/124; H01L 27/1218; H10K 59/1213; H10K 59/126; H10K 59/131
See application file for complete search history.

(56) References Cited

U.S. PATENT DOCUMENTS

| | | | | |
|---|---|---|---|---|
| 2021/0210564 | A1* | 7/2021 | Chae .................. | H10K 50/8445 |
| 2023/0157070 | A1* | 5/2023 | Yang .................. | H10K 59/1213 |
| | | | | 257/40 |

FOREIGN PATENT DOCUMENTS

CN     108287428 A     7/2018

\* cited by examiner

*Primary Examiner* — Mohammed R Alam
(74) *Attorney, Agent, or Firm* — East IP P.C.

(57) ABSTRACT

The present application discloses a display panel and a display apparatus. The display panel includes a substrate, a first shielding layer and a driving circuit layer. The first shielding layer is located on a side of the substrate, and the first shielding layer includes a plurality of first shielding units located in a first display region and a plurality of second shielding units located in a second display region. At least a portion of adjacent first shielding units are connected through first connecting parts, and a portion of adjacent second shielding units are connected through second connecting parts. The driving circuit layer is located on a side of the first shielding layer away from the substrate, the driving circuit layer includes a plurality of driving circuits, and each driving circuit includes a driving transistor.

20 Claims, 19 Drawing Sheets

DISPLAY PANEL AND DISPLAY APPARATUS

CROSS-REFERENCE TO RELATED APPLICATION

This application claims priority to Chinese Patent Application No. 202111659646.7, filed on Dec. 30, 2021, which is incorporated herein by reference in its entirety.

TECHNICAL FIELD

The present application relates to a technical field of display technology, and in particular to a display panel and a display apparatus.

BACKGROUND

The OLED display panel includes an array substrate. The array substrate includes a substrate and a driving circuit layer formed on the substrate. The external electric field, such as static electricity in the environment, or the electric field of the driving circuit layer, will cause the substrate to accumulate charges under the action of the electric field, which will affect the driving circuits located on the substrate. Thus, the display afterimage may appear, and the display quality of the display panel may be affected.

SUMMARY

Embodiments of the present application provide a display panel and a display apparatus.

In a first aspect, an embodiment of the present application provides a display panel including a substrate, a first shielding layer and a driving circuit layer. The first shielding layer is located on a side of the substrate, and the first shielding layer includes a plurality of first shielding units located in a first display region and a plurality of second shielding units located in a second display region. At least a portion of adjacent first shielding units are connected through first connecting parts, and a portion of adjacent second shielding units are connected through second connecting parts. The driving circuit layer is located on a side of the first shielding layer away from the substrate, the driving circuit layer includes a plurality of driving circuits, and each driving circuit includes a driving transistor. Here, first shielding units of the plurality of first shielding units and second shielding units of the plurality of second shielding units are in one-to-one correspondence with driving transistors, and orthographic projections of channel regions of active layers of the driving transistors on the first shielding layer are located in the first shielding units and the second shielding units.

In a second aspect, an embodiment of the present application provides a display apparatus including the display panel provided in the first aspect.

BRIEF DESCRIPTION OF THE DRAWINGS

In order to more clearly illustrate the technical solutions of the embodiments of the present application, the drawings to be used in the embodiments of the present application will be briefly introduced below. Obviously, the drawings described below are only some embodiments of the present application. For those of ordinary skill in the art, other drawings can be obtained based on these drawings without inventive effort.

In the figures.

Figure 1:
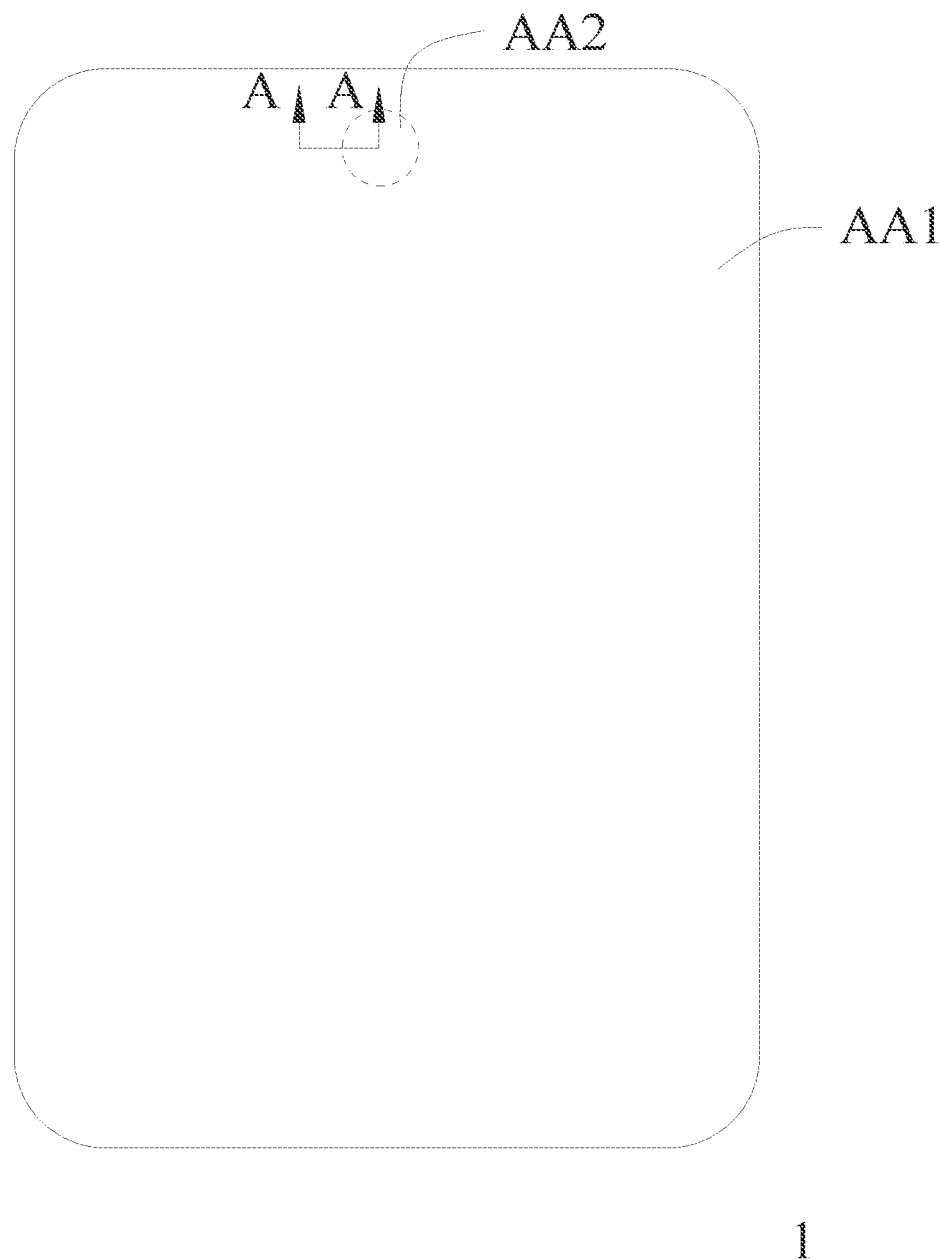
FIG. 1 is a top view schematic structural diagram of a first display panel provided by an embodiment of the present application.

1—display panel; 10—substrate; 11—first shielding layer; 111—first shielding unit; 112—second shielding unit; 113—first connecting part; 1131—first subsection; 1132—second subsection; 114—second connecting part; 1141—third subsection; 1142—fourth subsection; 115—third connecting part; 116—fourth connecting part; 117—fifth connecting part; 118—sixth connecting part; 119—seventh connecting part; 12—active layer; 121—channel region; 13—insulating layer; 14—buffer layer; 15—scan line; 16—first insulating layer; 17—gate layer; 171—gate; 172—first plate; 18—second insulating layer; 19—first metal layer; 191—second plate; 20—third insulating layer; 21—second metal layer; 211—source and drain; 22—first planarization layer; 23—second planarization layer; 2—display apparatus; 3—photosensitive module.

DETAILED DESCRIPTION

Features and exemplary embodiments of various aspects of the present application are described in detail below. In the following detailed description, numerous specific details are set forth in order to provide a thorough understanding of the present application. However, it will be apparent to those skilled in the art that the present application may be practiced without some of these specific details. The following description of the embodiments is merely to provide a better understanding of the present application by illustrating examples of the present application.

It should be noted that, in the present application, relational terms, such as first and second, are used merely to distinguish one entity or operation from another entity or operation, without necessarily requiring or implying any actual such relationships or orders of these entities or operations. Moreover, the terms "comprise", "include", or any other variants thereof, are intended to represent a non-exclusive inclusion, such that a process, method, article or device including a series of elements includes not only those elements, but also other elements that are not explicitly listed or elements inherent to such a process, method, article or device. Without more constraints, the elements following an expression "comprise/include . . . " do not exclude the existence of additional identical elements in the process, method, article or device that includes the elements.

In the related art, a display apparatus includes a display panel and a photosensitive module. The photosensitive module needs to receive lights to work normally. The photosensitive module includes a camera module for photography and an optical fingerprint identification module for fingerprint identification, and the like. Therefore, the function of the display apparatus is increased, the use interest of the display apparatus is enhanced, and the needs of the user is met. One way of integrating the photosensitive module is to integrate the photosensitive module below the display panel, so as to prevent the integration of the photosensitive module from affecting the display area of the display panel. Specifically, the display panel includes a first display region and a second display region, and the light transmittance of the second display region is greater than the light transmittance of the first display region. The photosensitive module is integrated on the side of the display panel away from the light-emitting surface, and is opposite to the second display region. Therefore, the working effect of the photosensitive module is better, and at the same time, the second display region can display, so as to maintain the display area of the display panel and improve the user experience.

The display panel in the display apparatus includes an array substrate and light-emitting units that emit light when driven by the array substrate. The array substrate includes a substrate and a driving circuit layer formed on the substrate. The driving circuit layer is used to drive the light-emitting units to emit light. During the use of the display panel, the substrate will accumulate charges under the action of the electric field. The electric field includes the external electric field, such as static electricity in the environment, or the electric field of the driving circuit layer itself. The performance of the driving transistors in the driving circuit layer on the substrate may be affected by the charges accumulated in the substrate. Therefore, the driving transistors will be abnormal when driving the light-emitting units to emit light, which in turn will cause appearance of the display afterimage on the display panel, and affect the display quality of the display panel.

In order to better understand the present application, the display panel and the display apparatus of the embodiments of the present application will be described in detail below with reference to FIG. 1 to FIG. 19.

Figure 2:
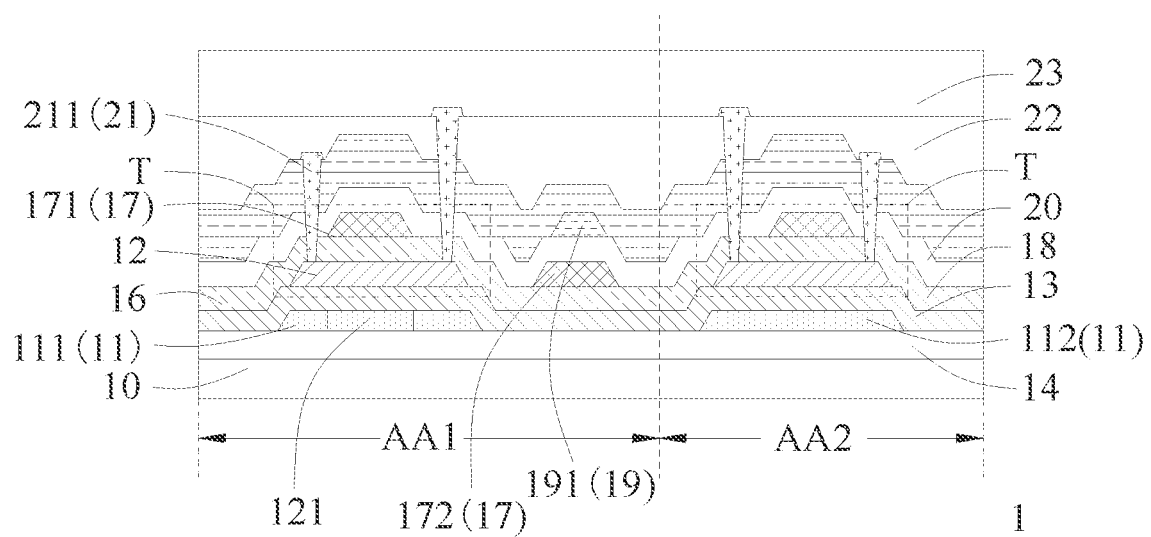
FIG. 2 is a cross sectional schematic structural diagram of an A-A region in FIG. 1.
Figure 3:
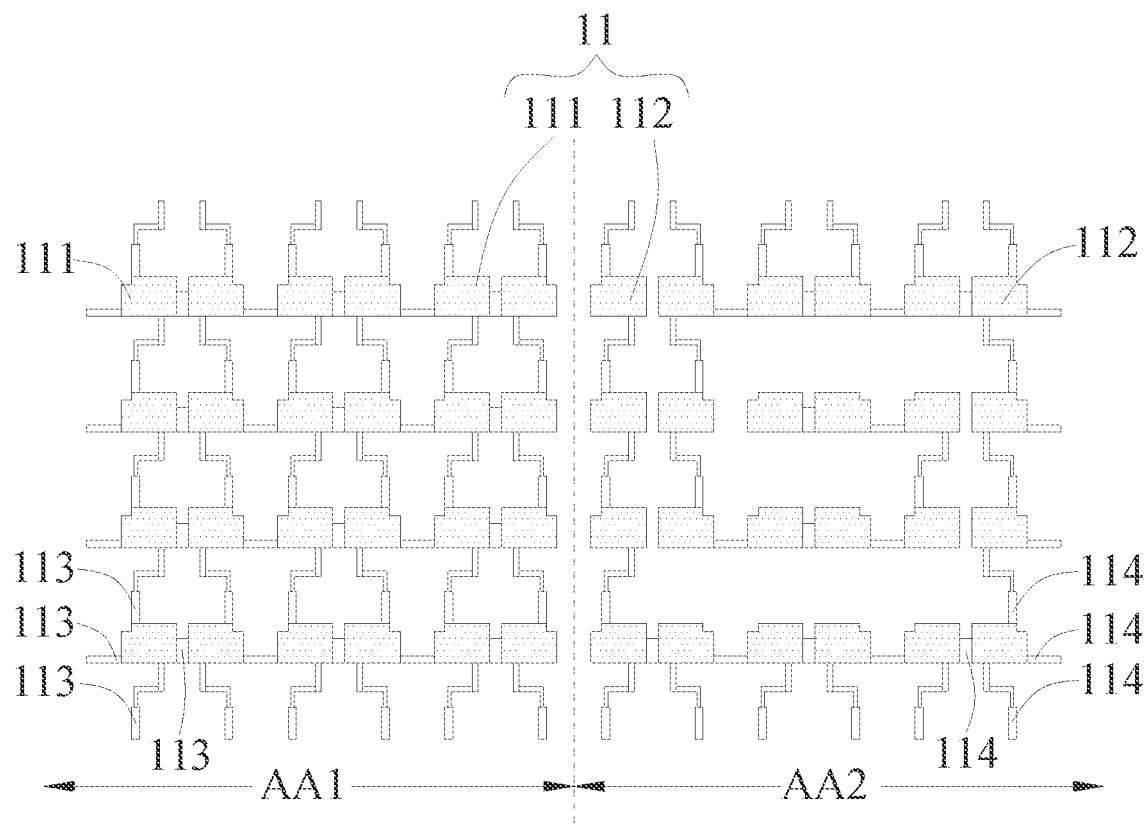
FIG. 3 is a top view schematic structural diagram of the A-A region in FIG. 1.

Referring to FIGS. 1 to 3, an embodiment of the present application provides a display panel 1 including a first display region AA1 and a second display region AA2. The display panel 1 includes a substrate 10, a first shielding layer 11 and a driving circuit layer. The first shielding layer 11 is located on a side of the substrate 10, and the first shielding layer 11 includes a plurality of first shielding units 111 located in the first display region AA1 and a plurality of second shielding units 112 located in the second display region AA2. At least a portion of adjacent first shielding units 111 are connected through first connecting parts 113, and a portion of adjacent second shielding units 112 are connected through second connecting parts 114. The driving circuit layer is located on a side of the first shielding layer 11 away from the substrate 10, the driving circuit layer includes a plurality of driving circuits, and each driving circuit includes a driving transistor T. Here, first shielding units 111 of the plurality of first shielding units 111 and second shielding units 112 of the plurality of second shielding units 112 are in one-to-one correspondence with driving transistors T, and orthographic projections of channel regions 121 of active layers 12 of the driving transistors T on the first shielding layer 11 are located in the first shielding units 111 and the second shielding units 112.

In the display panel 1 provided by the present application, the first shielding layer 11 is arranged between the substrate 10 and the driving circuit layer, and the first shielding layer 11 is patterned to include the plurality of first shielding units 111 located in the first display region AA1 and the plurality of second shielding units 112 located in the second display region AA2. At least a portion of the adjacent first shielding units 111 are connected through the first connecting parts 113, and a portion of the adjacent second shielding units 112 are connected through the second connecting parts 114. Further, the orthographic projections of the channel regions 121 of the active layers 12 of the driving transistors T on the first shielding layer 11 are located in the first shielding units 111 and the second shielding units 112. Therefore, the channel regions of the active layers 12 of the driving transistors T located in the first display region AA1 can be shielded by the first shielding units 111, so that the driving transistors T located in the first display region AA1 in the drive circuit layer may be prevented from being interfered by the electric field, which otherwise will cause the direct threshold voltages of the driving transistors T located in the first display region AA1 to shift, and affect the display effect of the first display region AA1. Further, the channel regions 121 of the active layers 12 of the driving transistors T located in the second display region AA2 can be shielded by the second shielding units 112, so that the driving transistors T located in the second display region AA2 in the drive circuit layer may be prevented from being interfered by the electric field, which otherwise will cause the direct threshold voltages of the driving transistors T located in the second display region AA2 to shift, and affect the display effect of the second display region AA2. That is, the shielding effect of the first shielding layer 11 can effectively prevent the driving transistors T from being interfered by the electric field in the substrate 10, such that the display effect of the display panel 1 may be improved and the occurrence of poor display may be prevented. Further, in the second display region AA2, only a portion of the adjacent second shielding units 112 are connected by the second connecting parts 114, and a portion of the adjacent second shielding units 112 are not provided with the second connecting parts 114, so that the influence of the second connecting parts 114 on the light transmittance of the second display region AA2 may be reduced. Therefore, the light transmittance of the second display region AA2 may be improved, and the photosensitive module opposite to the second display region AA2 can work better.

In a possible implementation, the substrate 10 may be made of polymer materials such as glass, polyimide (PI), polycarbonate (PC), polyethersulfone (PES), polyethylene terephthalate (PET), polyethylene naphthalate (PEN), polyarylate (PAR) or glass fiber reinforced plastic (FRP). The substrate 10 may be transparent, translucent or opaque. The substrate 10 in the embodiment of the present application may also be a flexible substrate, which is formed of a polymer with a relatively thin thickness, such as polyimide. A buffer layer 140 may be disposed on the substrate, and the buffer layer 140 may include a multilayer inorganic and organic layer stack structure to block oxygen and moisture, prevent moisture or impurities from diffusing through the substrate, and provide a flat surface for the preparation of subsequent film layers, thereby facilitating the preparation of subsequent film layers.

In a possible implementation, the display panel 1 further includes an insulating layer 13 formed between the first shielding layer 11 and the driving circuit layer, so as to achieve mutual insulation between the first shielding layer 11 and the driving circuit layer.

In a possible implementation, the driving circuit layer also includes other transistors other than the driving transistors T and devices such as capacitors. Specifically, the driving circuit layer includes a first insulating layer 16, a gate layer 17, a second insulating layer 18, a first metal layer 19, the third insulating layer 20, the second metal layer 21, the first planarization layer 22, the second planarization layer 23, and the like. These layers are located on the side of the active layer 12 away from the substrate 10 and are sequentially stacked along the direction away from the substrate 10. Here, the first insulating layer 16 is used to insulate the gate layer 17 and the active layer 13. The gate layer 17 includes the gate 171 of the transistor and the first plate 172 of the capacitor. The first metal layer 19 includes the second plate 191 of the capacitor. The second metal layer 21 includes the source and drain 211 of the transistor. The materials of the gate layer 17 and the first metal layer 19 are metal such as molybdenum. In the direction away from the substrate 10, the second metal layer 21 may include a first titanium metal layer, an aluminum metal layer and a second titanium metal layer that are stacked; or, the second metal layer 21 may include a molybdenum metal layer. The materials of the first planarization layer 22 and the second planarization layer 23 can be selected from organic materials, and the surfaces of the first planarization layer 22 and the second planarization layer 23 facing away from the substrate 10 are flat surfaces, thereby facilitating the preparation of subsequent film layers.

It can be understood that, continue to refer to FIG. 2, the channel region 121 of the active layer 12 of the driving transistor T is a portion of the active layer 12 of the driving transistor T overlapped with the gate 171 of the driving transistor T in the direction perpendicular to the substrate 10.

The active layer 12 also includes source-drain bonding regions located on both sides of the channel region 121.

In a possible implementation, the material of the first shielding layer 11 includes molybdenum. Specifically, the material of the first shielding units 111, the second shielding units 112, the first connecting parts 113 and the second connecting parts 114 can be molybdenum (Mo). The conductivity of molybdenum is good, and the single molybdenum metal layer has lower resistance, which can improve the export speed of the electric field, so that the shielding effect of the first shielding layer 11 is better. Further, the first shielding layer 11 uses only one material, which can reduce the preparation process.

In another possible implementation, the material of the first shielding units 111 includes molybdenum; each of the second shielding units 112 includes a silicon material layer, a silicon dioxide material layer and a molybdenum metal layer sequentially arranged along the direction away from the substrate 10.

In the above implementations, the material of the first shielding units 111 and the first connecting parts 113 can be molybdenum. The conductivity of molybdenum is good, and the first shielding units 111 and the first connecting parts 113 are made of single molybdenum metal layer, which has low resistance and can improve the export speed of the electric field. Therefore, the shielding effect of the first shielding units 111 are better. The second shielding units 112 and the second connecting parts 114 may each include a silicon material layer, a silicon dioxide material layer and a molybdenum metal layer that are stacked. Here, the silicon material layer is located on the side of the silicon dioxide material layer close to the substrate 10, and the molybdenum metal layer is located on the side of the silicon dioxide material layer away from the substrate 10. That is, the photosensitive module is located on the side of the silicon material layer away from the molybdenum material layer. The silicon material layer may be single crystal silicon and amorphous silicon. The single crystal silicon is gray-black, and the amorphous silicon is black, so the single crystal silicon and the amorphous silicon have excellent light absorption ability. Therefore, the silicon material layer is arranged on the side of the molybdenum metal layer close to the substrate, which can prevent the light shining on the side of the molybdenum metal layer towards the silicon metal layer from being reflected by the molybdenum metal layer into the photosensitive module. Thus, the interference to the photosensitive module may be avoided, and the photosensitive module can work better. At the same time, due to the poor electron transport ability of the silicon material layer, the silicon dioxide material layer is arranged between the silicon material layer and the molybdenum metal layer to insulate the silicon material layer and the molybdenum metal layer. Therefore, the transport ability of the molybdenum metal layer can be prevented from being affected by the direct contact between the silicon material layer and the molybdenum metal layer, so as to ensure the export speed of the electric field of the molybdenum metal layer and make the shielding effect of the second shielding units 112 better.

In a possible implementation, as shown in FIG. 3, each of the first shielding units 111 is connected with N first connecting parts 113, and at least one of the second shielding units 112 is connected with n second connecting parts 114, wherein n<N.

In the above implementations, the number of the second connecting parts 114 connected to the at least one of the second shielding units 112 is smaller than the number of the first connecting parts 113 connected to each of the first shielding units 111. That is, in the same area of the first display region AA1 and the second display region AA2, the area of the orthographic projections of the first connecting parts 113 on the substrate is larger than the area of the orthographic projections of the second connecting parts 114 on the substrate. Therefore, the light transmittance of the second display region AA2 is greater than the light transmittance of the first display region AA1. For example, in FIG. 3, each of the first shielding units 111 is connected with four first connecting parts 113, that is, N=4; at least a portion of the second shielding units are connected with one to three second connection parts 114, that is, n=1~3, and n is an integer. In the above implementations, by reducing the number of the second connecting parts 114 connected to the at least one of the second shielding units 112, the number of the second connecting parts 114 in the second display region AA2 is reduced, so that the light transmittance of the second display region AA2 is higher. At the same time, the number of the first connecting parts 113 connected to the first shielding units 111 is maintained, so that more adjacent first shielding units 111 are connected in parallel, thereby helping to reduce impedance. Thus, the first shielding units 111 has faster charge conduction speed and better electrostatic shielding effect.

Figure 4:
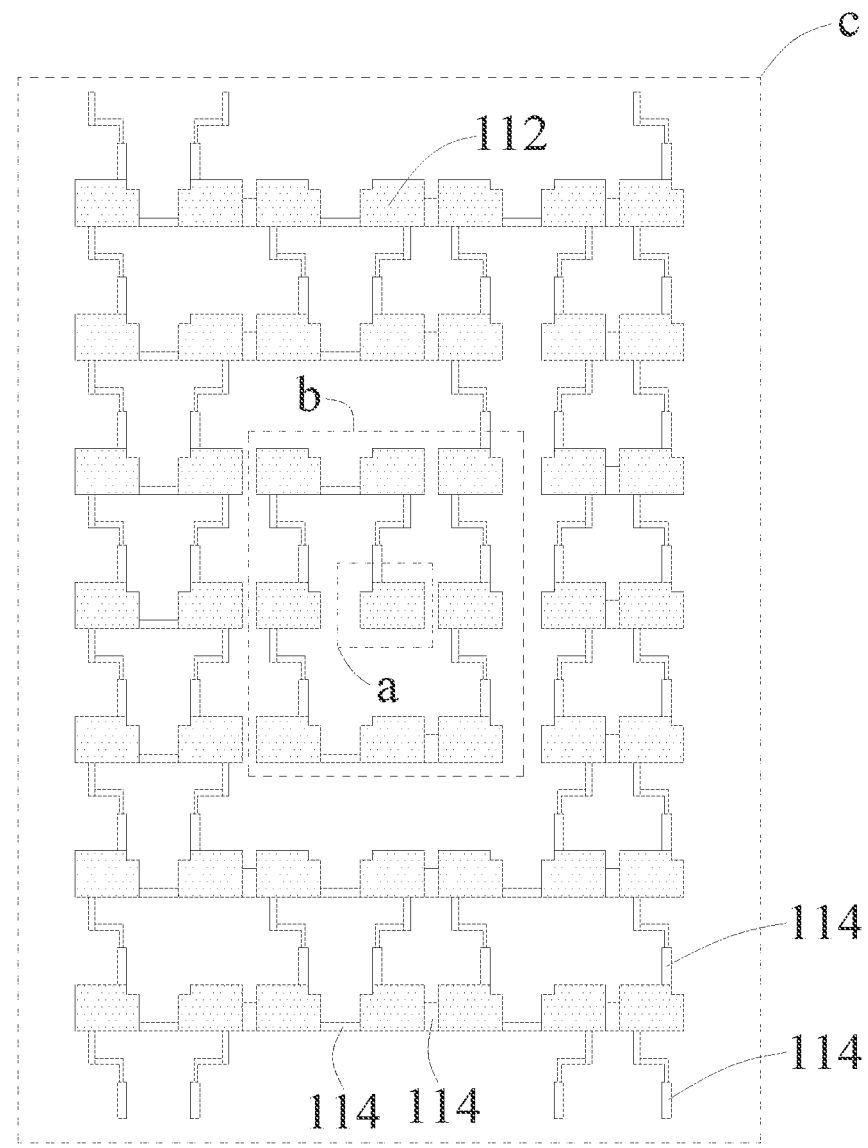
FIG. 4 is a schematic structural diagram of a second display region in a second display panel provided by an embodiment of the present application.

In a possible implementation, the distribution density of the second connecting parts 114 gradually decreases from a side close to the first display region AA1 to a side away from the first display region AA1. As shown in FIG. 4, there are three regions. Here, the c region is located on the side close to the first display region AA1 relative to the a region, the b region is located between the a region and the c region. The number of the second connecting parts 114 connected to each second shielding unit 112 in the a area is one, the number of the second connecting parts 114 connected to each second shielding unit 112 in the b area is two, and the number of the second connecting parts 114 connected to each second shielding unit 112 in the c area is three. The distribution density of the second connecting parts 114 in the a region is smaller than the distribution density of the second connecting parts 114 in the b region, and the distribution density of the second connecting parts 114 in the b region is smaller than the distribution density of the second connecting parts 114 in the c region. Therefore, the light transmittance of the second display region AA2 gradually increases from the side close to the first display region AA1 to the center of the second display region AA2. Under the condition that the number of the second connecting parts 114 in the second display region AA2 is guaranteed to be constant, the position with high light transmittance is concentrated in the center of the second display region AA2 by adjusting the distribution density of the second connecting parts 114 at each position, and the photosensitive region of the photosensitive module is opposite to the center of the second display region AA2, thereby achieving better photosensitive effect.

In a possible implementation, the second shielding unit 112 is connected with n second connecting parts 114, and n can be zero. That is, the second shielding unit 112 can exist independently, not connected to the adjacent second shielding unit 112, and can also play the role of electrostatic shielding.

Figure 5:
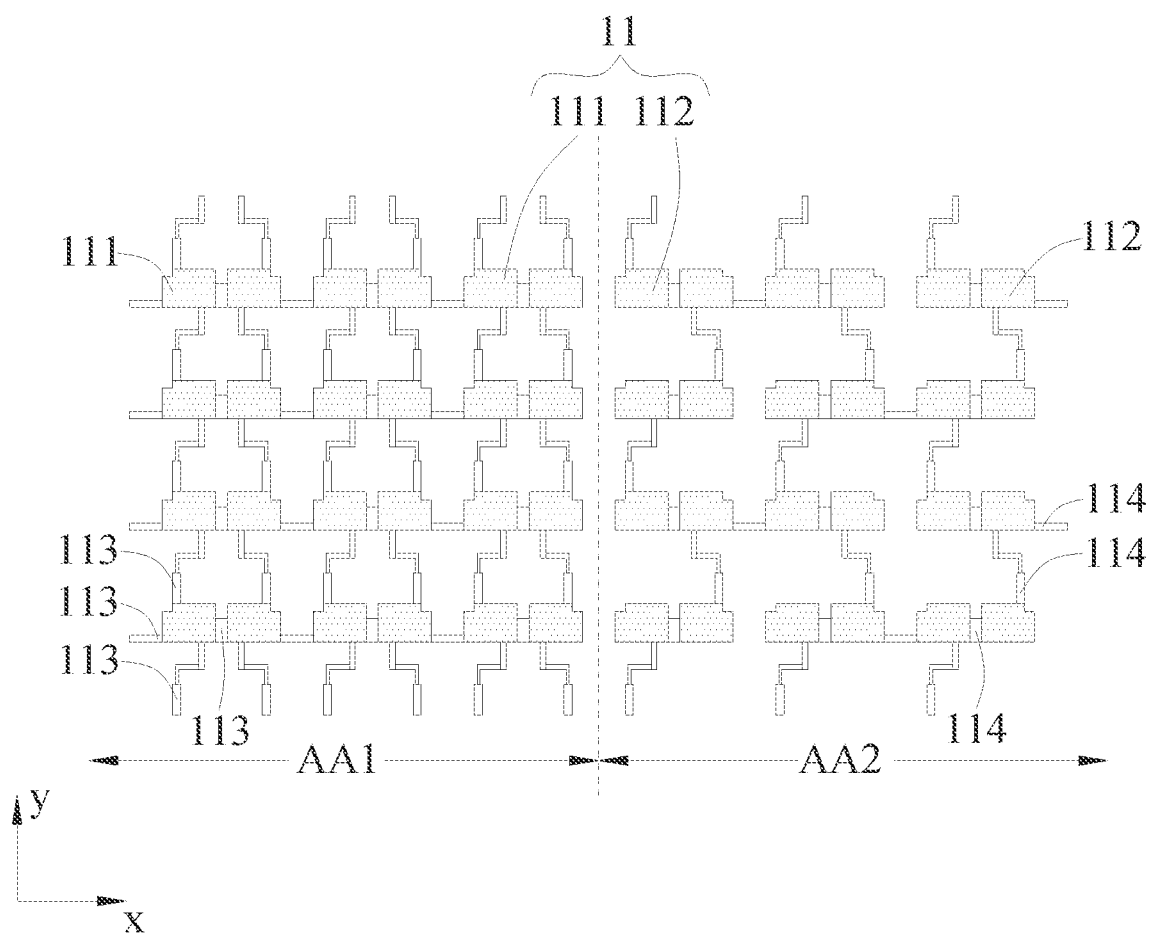
FIG. 5 is a partial schematic structural diagram of a third display panel provided by an embodiment of the present application.

In a possible implementation, as shown in FIG. 5, the first shielding units 111 are arranged in rows and columns, adjacent first shielding units 111 along a row direction x are electrically connected through the first connecting parts 113, and adjacent first shielding units 111 along a column direction y are electrically connected through the first connecting parts 113; the second shielding units 112 are arranged in rows and columns, a portion of adjacent second shielding units 112 along a row direction x are connected through the second connecting parts 114, and a portion of adjacent second shielding units 112 in a column direction y are electrically connected through the second connecting parts 114.

In the above implementations, the first shielding units 111 and the second shielding units 112 are all arranged in rows and columns. The adjacent first shielding units 111 along the row direction x and the adjacent first shielding units 111 along the column direction y are all electrically connected through the first connecting parts 113, so that each first shielding unit 111 is connected to four first connecting parts 113. Only a portion of adjacent second shielding units 112 along a row direction x and a portion of adjacent second shielding units 112 in a column direction y are connected through the second connecting parts 114, so that the number of the second connecting parts connected to a portion of the second shielding units 112 is less than four. Therefore, the number of the second connecting parts 114 in the second display region AA2 is reduced, and the light transmittance of the second display region AA2 is higher. At the same time, the number of the first connecting parts 113 connected to the first shielding units 111 is maintained, so that more adjacent first shielding units 111 are connected in parallel, thereby helping to reduce impedance. Thus, the first shielding units 111 has faster charge conduction speed and better electrostatic shielding effect.

Figure 6:
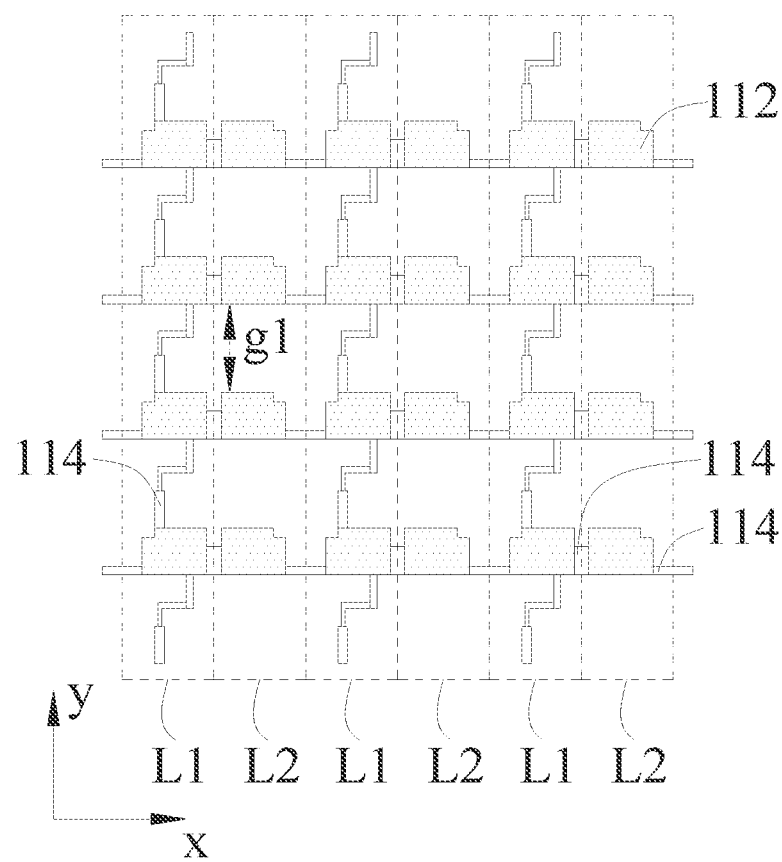
FIG. 6 is a partial schematic structural diagram of a fourth display panel provided by an embodiment of the present application.

In a possible implementation, as shown in FIG. 6, the second shielding units 112 are arranged in rows and columns, and adjacent second shielding units 112 in each row are electrically connected through the second connecting parts 114, and wherein the second display region AA2 includes a plurality of first preset columns L1 and a plurality of second preset columns L2, adjacent second shielding units 112 in the first preset columns L1 are electrically connected through the second connecting parts 114, and adjacent second shielding units 112 in the second preset columns L2 have first preset gaps g1.

In the above implementations, the number of the second connecting parts 114 used for connecting the adjacent second shielding units 112 in the column direction y in the second preset column L2 is reduced, and the second shielding units 112 in the second preset column L2 are all electrically connected to the second shielding units 112 in the adjacent first preset column L1 through the second connecting parts 114. Therefore, the number of the second connecting parts 114 in the second display region AA2 is reduced, and the light transmittance of the second display region AA2 is higher.

Figure 7:
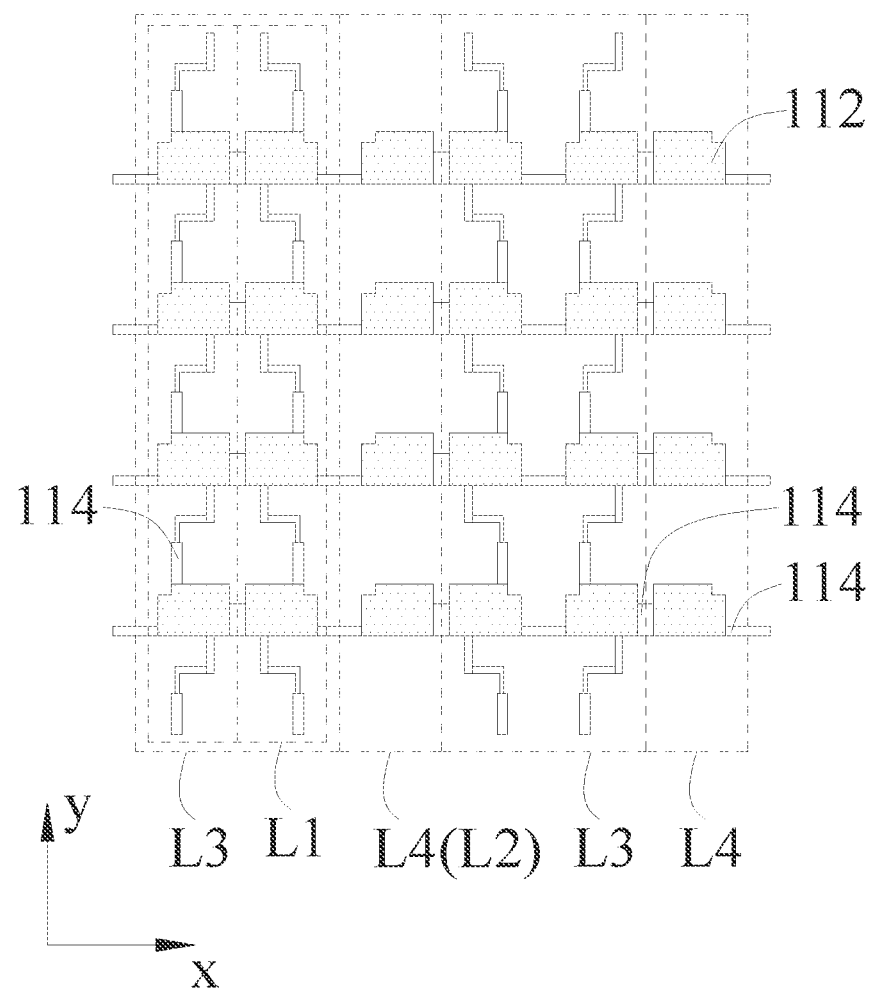
FIG. 7 is a partial schematic structural diagram of a fifth display panel provided by an embodiment of the present application.

In a possible implementation, as shown in FIG. 7, the second display region AA2 includes a first preset column group L3 containing at least one of the first preset columns L1 and a second preset column group L4 containing at least one of the second preset columns L2, and the first preset column group L3 and the second preset column group L4 are alternately arranged.

In the above implementations, the first preset column group L3 may include one or more first preset columns L1, and the second preset column group L4 may include one or more second preset columns L2. The number of the first preset columns L1 in the first preset column group L3 and the number of the second preset columns L2 in the second preset column group L4 may be the same or different. The first preset column group L3 and the second preset column group L4 are alternately arranged. The number of the second connecting parts 114 in the second preset column L2 in the second preset column group L4 is reduced, and the number of the second connecting parts 114 in the second display region AA2 is reduced. Therefore, the light transmittance of the second display region AA2 is higher. The reduction of the number of the second connecting parts 114 in the second preset column group L4 will increase the light transmittance of the portion of the second display region AA2 corresponding to the second preset column group L4, but at the same time, there will be a certain increase in transport resistance. The number of the second connecting parts 114 in the first preset column group L3 is larger than the number of the second connecting parts 114 in the second preset column group LA. Therefore, the light transmittance of the portion of the second display region AA2 corresponding to the first preset column group L3 is low, but the transport resistance is also reduced. In this embodiment, the first preset column group L3 and the second preset column group L4 are alternately arranged, so that the light transmittance of the second display region AA2 may be uniformly distributed, and the transport resistance may be evenly distributed.

Figure 8:
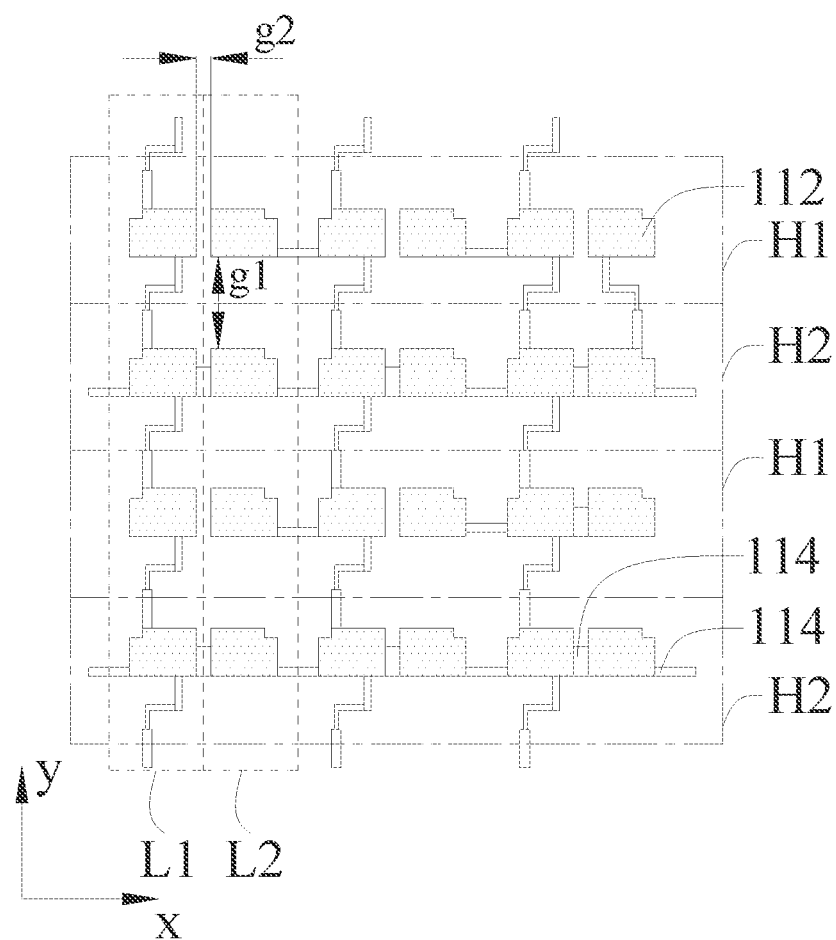
FIG. 8 is a partial schematic structural diagram of a sixth display panel provided by an embodiment of the present application.

In a possible implementation, as shown in FIG. 8, the second shielding units 112 are arranged in rows and columns, the second display region AA2 includes a plurality of first preset rows H1 and a plurality of second preset rows H2, at least a portion of adjacent second shielding units 112 in the first preset rows H1 have second preset gaps g2, and adjacent second shielding units 112 in the second preset rows H2 are electrically connected through the second connecting parts 114; the second display region AA2 includes a plurality of first preset columns L1 and a plurality of second preset columns L2, adjacent second shielding units 112 in the first preset columns L1 are electrically connected through the second connecting parts 114, and adjacent second shielding units 112 in the second preset columns L2 have first preset gaps g1.

In the above implementations, the number of the second connecting parts 114 used for connecting the adjacent second shielding units 112 in the row direction x in the first preset row H1 is reduced. At least a portion of the second shielding units 112 in the first preset row H1 are only electrically connected to the second shield units 112 in the adjacent second preset row H2 through the second connecting parts 114. At the same time, the number of the second connecting parts 114 used for connecting the adjacent second shielding units 112 in the column direction y in the second preset column L2 is reduced. Therefore, a portion of the second shielding units 112 in the second preset column L2 are only connected to the adjacent second shielding units 112 in the row direction x. That is, a portion of the second shielding units 112 in the second preset column L2 are electrically connected to the second shielding units 112 in the adjacent first preset column L1 through the second connecting parts 114. In the above implementations, the number of the second connecting parts 114 between the adjacent second shielding units 112 in the column direction y is reduced, which can further improve the light transmittance of the second display region AA2. At the same time, the light transmission regions corresponding to the first preset gaps g1 and the second preset gaps g2 are more uniformly distributed, so that the light transmission of the second display region AA2 is more uniform.

Figure 9:
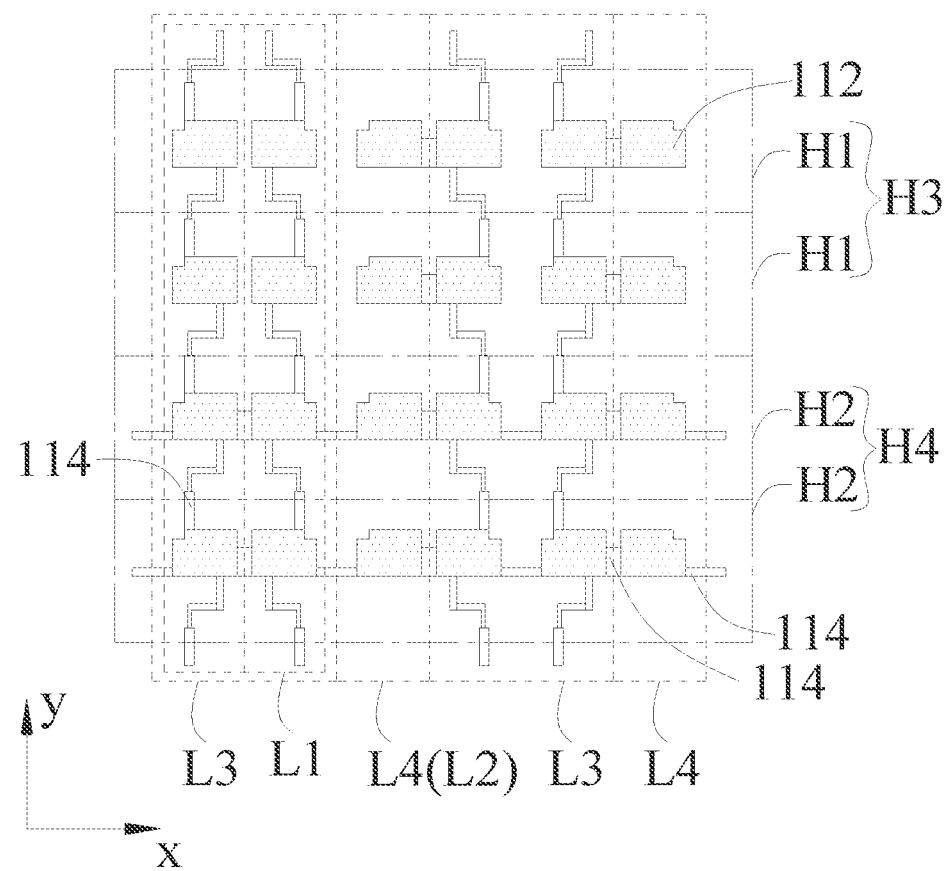
FIG. 9 is a partial schematic structural diagram of a seventh display panel provided by an embodiment of the present application.

In a possible implementation, as shown in FIG. 9, the second display region AA2 includes a first preset row group H3 containing at least one of the first preset rows H1 and a second preset row group H4 containing at least one of the second preset rows H2, and the first preset row group H3 and the second preset row group H4 are alternately arranged.

The second display region includes a first preset column group L3 containing at least one of the first preset columns L1 and a second preset column group L4 containing at least one of the second preset columns L2, and the first preset column group L3 and the second preset column group L4 are alternately arranged.

In the above implementations, the first preset row group H3 may include one or more first preset rows H1, and the second preset row group H4 may include one or more second preset rows H2. The number of the first preset rows H1 in the first preset row group H3 and the number of the second preset rows H2 in the second preset row group H4 may be the same or different. The first preset row group H3 and the second preset row group H4 are alternately arranged. Meanwhile, the first preset column group L3 may include one or more first preset columns L1, and the second preset column group L4 may include one or more second preset columns L2. The number of the first preset columns L1 in the first preset column group L3 and the number of the second preset columns L2 in the second preset column group L4 may be the same or different. The first preset column group L3 and the second preset column group L4 are alternately arranged. In the above implementations, the number of the second connecting parts 114 in the first preset row H1 in the first preset row group H3 is reduced, and the number of the second connecting parts 114 in the second preset column L2 in the second preset column group L4 is reduced. Therefore, the number of the second connecting parts 114 in the second display region AA2 is further reduced, so that the light transmittance of the second display region AA2 is higher.

Figure 10:
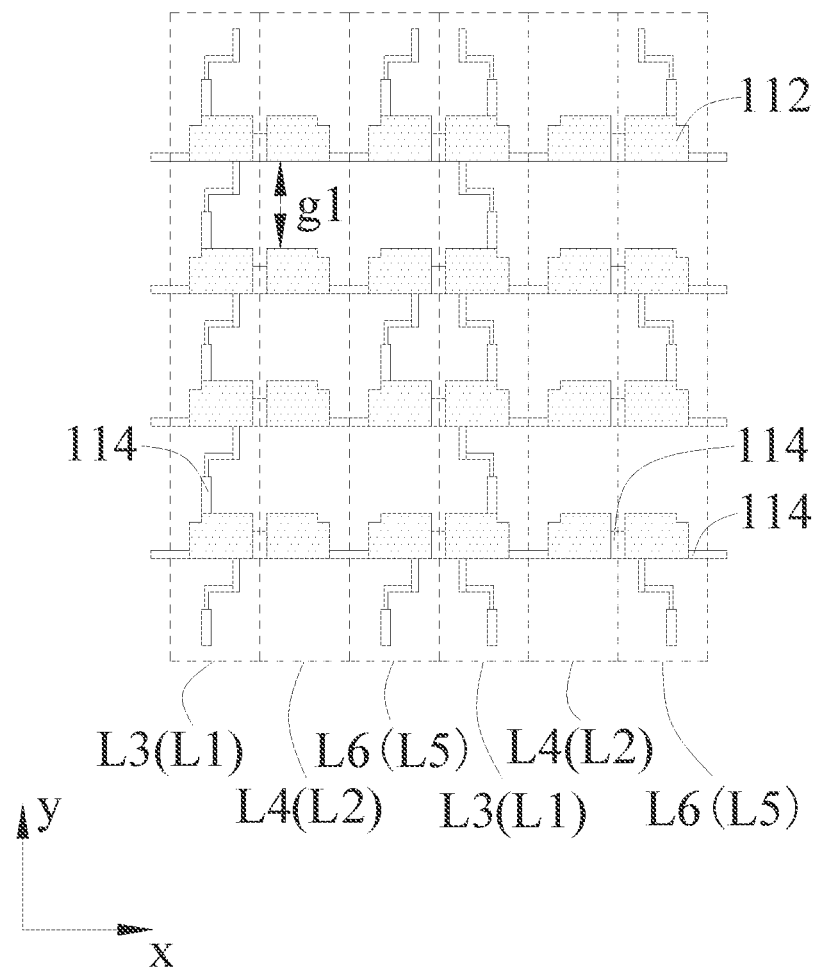
FIG. 10 is a partial schematic structural diagram of an eighth display panel provided by an embodiment of the present application.

In a possible implementation, as shown in FIG. 10, the second display region AA2 further includes a plurality of third preset columns L5, a portion of adjacent second shielding units 112 in the third preset columns L5 are electrically connected through the second connecting parts 114, and a portion of adjacent second shielding units 112 in the third preset columns L5 have first preset gaps g1. The second display region AA2 further includes a third preset column group L6 containing at least one of the third preset columns L5, and the first preset column group L3, the second preset column group L4 and the third preset column group L6 are arranged in sequence.

In the above implementations, the third preset columns in which a portion of adjacent second shielding units 112 in the column direction y are electrically connected through the second connecting parts 114 and a portion of adjacent second shielding units 112 in the column direction y have first preset gaps g1 are added. Therefore, another way to adjust the light transmittance of the second display region AA2 is added, so that the light transmittance of the second display region AA2 may be further adjusted.

Figure 11:
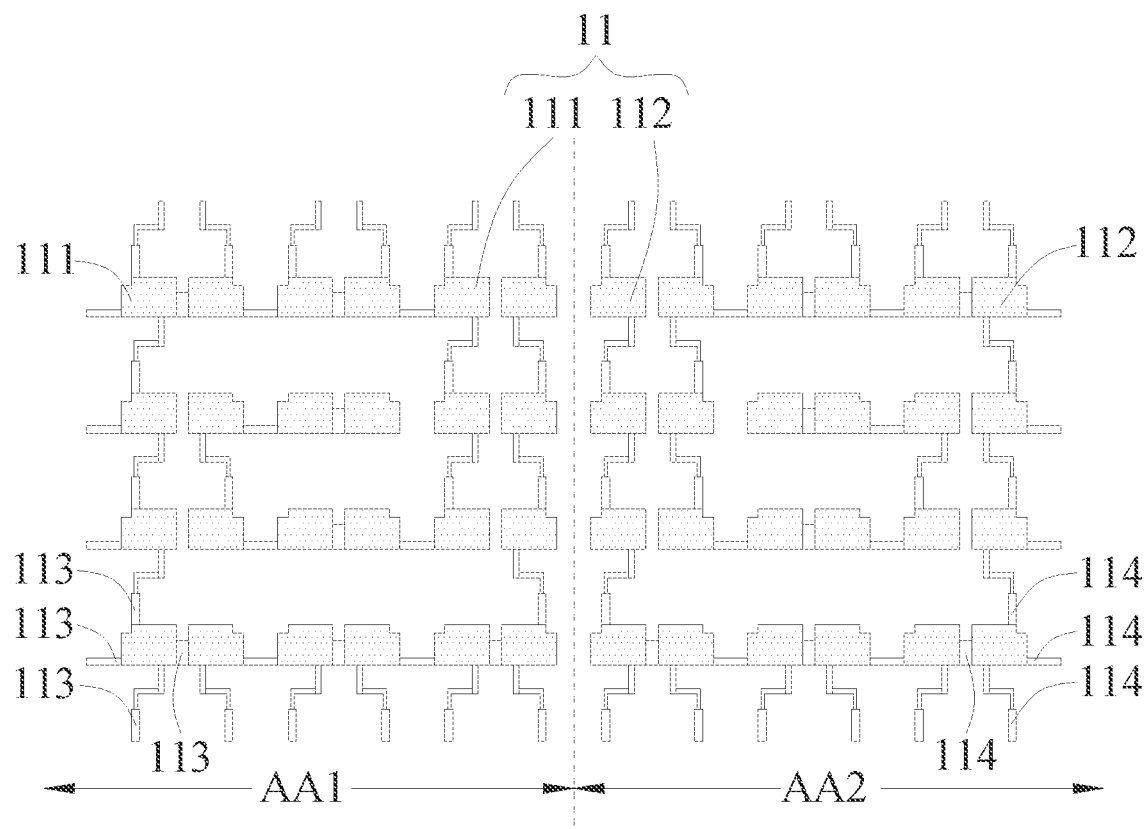
FIG. 11 is a partial schematic structural diagram of a ninth display panel provided by an embodiment of the present application.

In a possible implementation, as shown in FIG. 11, each of the first shielding units 111 is connected with N first connecting parts 113, and at least one of the second shielding units 112 is connected with n second connecting parts 114, wherein n=N.

In the above implementations, the number of the first connecting parts 113 connected to each first shielding unit 111 is the same as the number of the second connecting parts 114 connected to each second shielding unit 112. Therefore, it is convenient to synchronously pattern the portions of the first shielding layer 11 located in the first display region AA1 and in the second display region AA2, which makes the manufacture more convenient. At the same time, on the basis of ensuring that the second shielding units 112 in the second display region AA2 are all electrically connected, the number of the second connecting parts 114 between adjacent shielding units 112 is reduced, thereby improving the light transmittance of the second display region AA2.

In the above implementations, N may be 1, 2, 3 or 4.

In a possible implementation, the first shielding units 111 are connected to a first fixed electric potential, and the second shielding units 112 are connected to a second fixed electric potential, wherein the first fixed electric potential and the second fixed electric potential may be the same or different. The first fixed electric potential and the second fixed electric potential are respectively used to provide electric potentials to the first shielding units 111 and the second shielding units 112. On the one hand, the first shielding units 111 and the second shielding units 112 can realize the shielding effect on the electric field. On the other hand, the resistance in the driving circuit layer may be reduced by the first shielding units 111 and the second shielding units 112.

Figure 12:
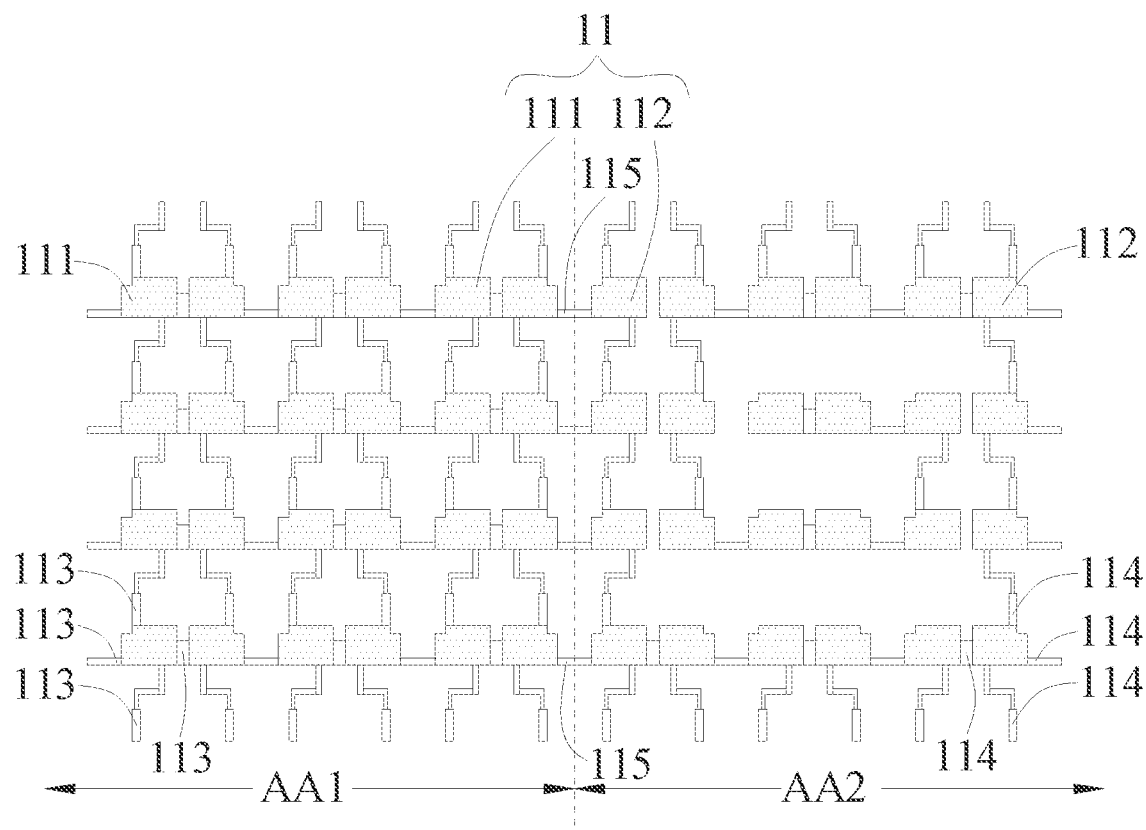
FIG. 12 is a partial schematic structural diagram of a tenth display panel provided by an embodiment of the present application.

In a possible implementation, as shown in FIG. 12, the first fixed electric potential and the second fixed electric potential are a same electric potential, and at least a portion of adjacent first shielding units 111 and second shielding units 112 are connected through third connecting parts 115.

In the above implementations, the first shielding units 111 and the second shielding units 112 are connected through the third connecting parts 115, so that the first shielding units 111 and the second shielding units 112 are connected to the same potential. The third connecting parts 115 may be one or more. The third connecting parts 115 can be disposed in the first display region AA1 or in the second display region AA2, or a portion of the third connecting parts 115 can be disposed in the first display region AA1 and a portion of the third connecting parts 115 can be disposed in the second display region AA2. Under a condition that the third connecting parts 115 are disposed in the first display region AA1, the influence on the light transmittance of the second display region AA2 can be reduced, which helps to ensure the effect of the photosensitive module. Under a condition that there are multiple third connecting parts 115, at least a portion of the first shielding units 111 and the second shielding units 112 are connected in parallel, thereby reducing the resistance of the first shielding layer 11.

In another possible implementation, each of the first shielding units 111 and each of the second shielding units 112 are insulated from each other, the first fixed electric potential is greater than the second fixed electric potential, and wherein the driving circuit layer further includes a first power supply line PVDD and a reset signal line Vref, the first power supply line PVDD provides the first fixed electric potential, and the reset signal line Vref provides the second fixed electric potential.

In the above implementations, the first shielding units 111 and the second shielding units 112 are respectively connected to different fixed electric potentials. Specifically, the first shielding units 111 are connected to the first power supply line PVDD, and the second shielding units 112 are connected to the reset signal line Vref.

The area of the first display region AA1 in the display panel 1 is larger than the area of the second display region AA2, so the total area of the first shielding units 111 located in the first display region AA1 is larger than the total area of the second shielding units 112 located in the second display region AA2. In the driving circuit layer, the first power supply line PVDD and the reset signal line Vref are both affected by the IR-drop caused by their own resistances. The electric potential of the first power supply line PVDD is relatively large and is greatly affected by the IR-drop. The electric potential of the reset signal line Vref is relatively small and is less affected by the IR-drop. By connecting the first shielding units 111 with a larger total area to the first power line PVDD, the first shielding units 111 with a larger total area can be used to improve the IR-drop of the power supply line PVDD. By connecting the second shielding units 112 with a smaller total area to the reset signal line Vref, the second shielding units 112 with a smaller total area can be used to improve the IR-drop of the reset signal line Vref. Therefore, the first shielding layer 11 may be used to improve the IR-drop of some signal lines in the driving circuit layer (for example, the first power supply line PVDD, the reset signal line Vref, etc.) while electrostatically shielding the driving circuits of the display panel 1, so that the driving circuits may achieve better performance.

Figure 13:
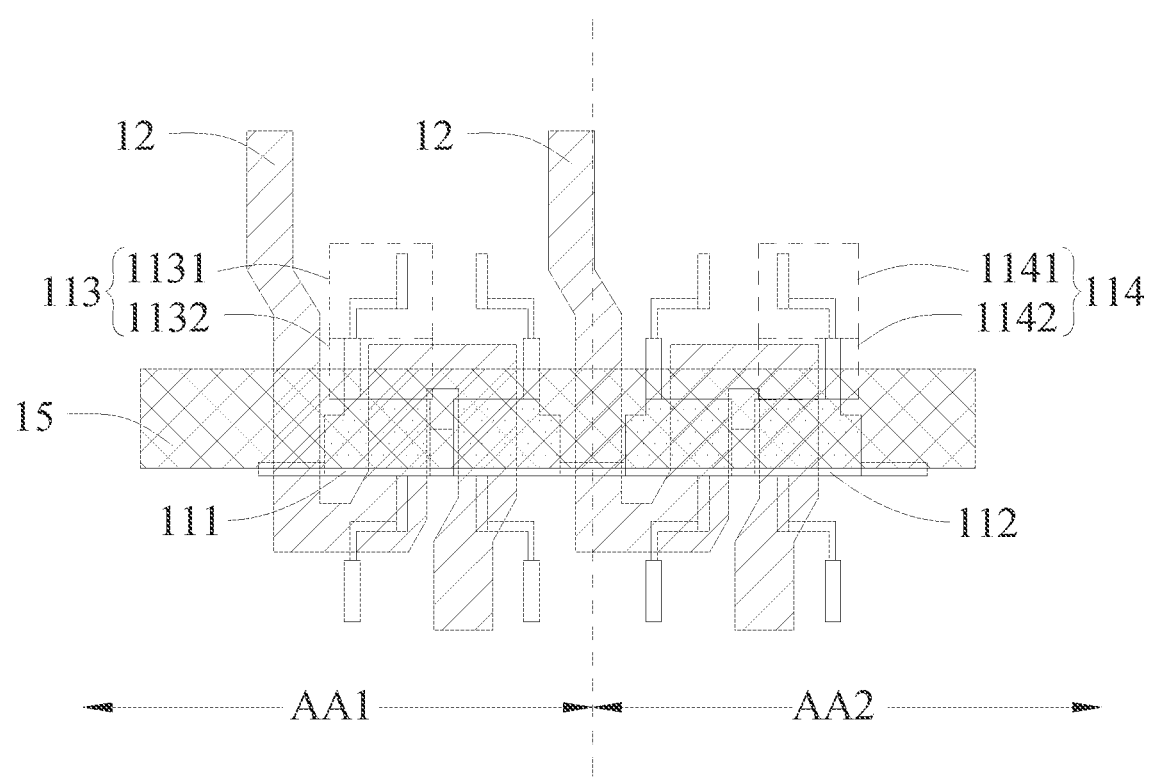
FIG. 13 is a partial schematic structural diagram of a film layer of the first display panel provided by an embodiment of the present application.
Figure 14:
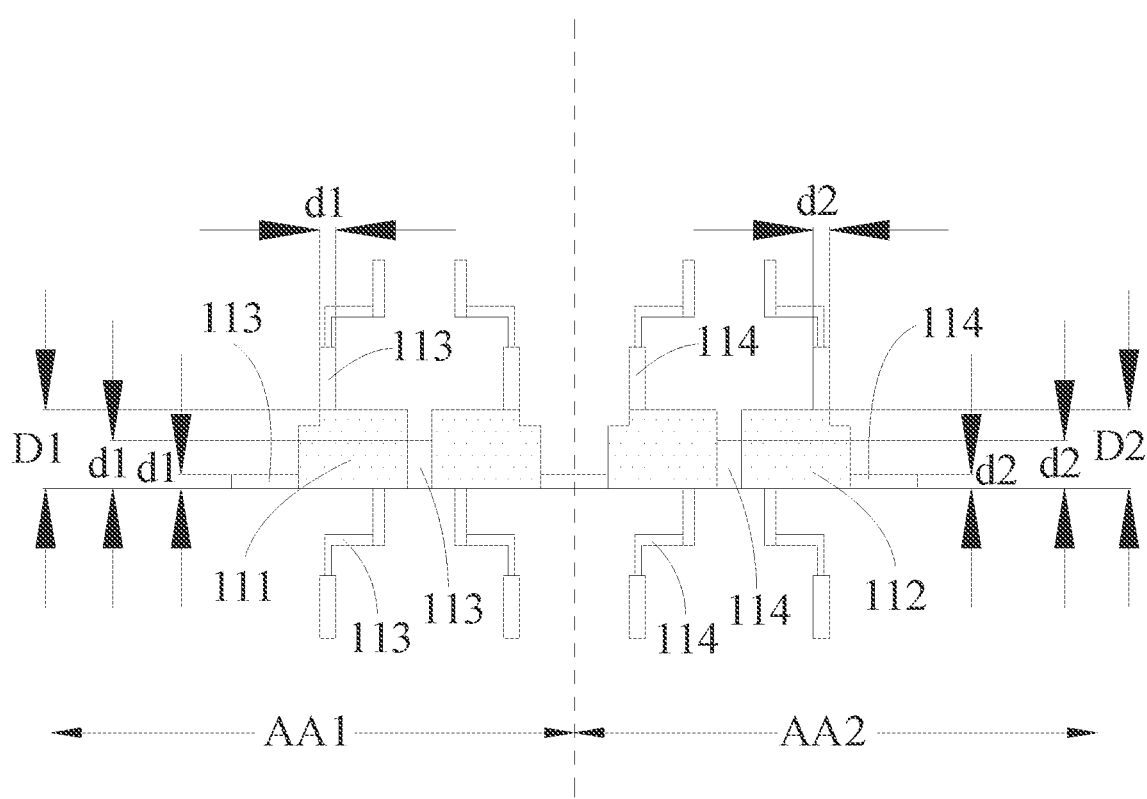
FIG. 14 is a partial schematic structural diagram of a size of the film layer of the first display panel provided by an embodiment of the present application.

In a possible implementation, the signal lines in the driving circuit layer may further include scan lines 14, and at least a portion of the scan lines 14 are located in the gate layer. As shown in FIGS. 13 and 14, a portion of the first connecting parts 113 include first subsections 1131 and second subsections 1132 located between the first subsections 1131 and the first shielding units 111. Line widths of the first subsections 1131 in a direction perpendicular to the extending direction of the first connecting parts 113 are smaller than line widths of the second subsections 1132 in a direction perpendicular to the extending direction of the first connecting parts 113.

In the above implementations, the line widths of the first subsections 1131 in the first connecting parts 113 may be set as relatively narrow. Therefore, a portion of the first subsections 1131 overlapped with the active layer 12 can be prevented from interfering the active layer 12 (for example, the nodes in the active layer 12 that are directly connected to the driving transistors, or the floating nodes, etc.), and thus the interference to the driving circuits may be avoided. The second subsections 1132 may overlap with the sources and drains of the driving transistors. Since the nodes corresponding to the sources and drains are relatively stable, these nodes are not easily interfered by the second subsections 1132. Therefore, the line widths of the second subsections 1132 in the first connecting parts 113 may be set as relatively wide, so as to reduce the resistances, improve the electrostatic discharge speed of the first shielding layer 11, and at the same time improve the effect of improving the IR-drop of some signal lines.

In a possible implementation, as shown in FIGS. 13 and 14, a portion of the second connecting parts 114 include third subsections 1141 and fourth subsections 1142. Line widths of the third subsections 1141 in a direction perpendicular to the extending direction of the second connecting parts 114 are smaller than line widths of the fourth subsections 1142 in a direction perpendicular to the extending direction of the second connecting parts 114. The fourth subsections 1142 and the second subsections 1132 overlap with the scan lines in a direction perpendicular to the substrate 10.

In the above implementations, the line widths of the third subsections 1141 in the second connecting parts 114 may be set as relatively narrow. Therefore, a portion of the third subsections 1141 overlapped with the active layer 12 can be prevented from interfering the active layer 12 (for example, the nodes in the active layer 12 that are directly connected to the driving transistors, or the floating nodes, etc.), and thus the interference to the driving circuits may be avoided. The fourth subsections 1142 may overlap with the sources and drains of the driving transistors. Since the nodes corresponding to the sources and drains are relatively stable, these nodes are not easily interfered by the fourth subsections 1142. At the same time, the fourth subsections 1142 may overlap with the scan lines. The fourth subsections 1142 has less influence on the scan lines. Therefore, the line widths of the fourth subsections 1142 in the second connecting parts 114 may be set as relatively wide, so as to reduce the resistances, improve the electrostatic discharge speed of the second shielding units 112, and at the same time improve the effect of improving the IR-drop of some signal lines.

In the above implementations, the second connecting parts 114 located between the adjacent first shielding units 111 in the column direction y or the adjacent second shielding units 112 in the column direction y include third subsections 1141 and fourth subsections 1142.

In the above implementations, the line widths of the third subsections 1141 in the second connecting parts 114 may be set as relatively narrow. Therefore, a portion of the third subsections 1141 overlapped with the active layer 12 can be prevented from interfering the active layer 12 (for example, the nodes in the active layer 12 that are directly connected to the driving transistors, or the floating nodes, etc.), and thus the interference to the driving circuits may be avoided. The fourth subsections 1142 may overlap with the sources and drains of the driving transistors. Since the nodes corresponding to the sources and drains are relatively stable, these nodes are not easily interfered by the fourth subsections 1142. Therefore, the line widths of the fourth subsections 1142 in the second connecting parts 114 may be set as relatively wide, so as to reduce the resistances, improve the electrostatic discharge speed of the first shielding layer 11, and at the same time improve the effect of improving the IR-drop of some signal lines.

In a possible implementation, as shown in FIG. 14, line widths d1 of the first connecting parts 113 are smaller than minimum widths D1 of the first shielding units 111 along a column direction y, and line widths d2 of the second connecting parts 114 are smaller than minimum widths D2 of the second shielding units 112 along the column direction y. The first shielding units 111 and the second shielding units 112 play the role of electrostatic shielding, and the orthographic projections of the active layers 12 of the driving transistors on the first shielding layer 11 are located in the first shielding units 111 and the second shielding units 112. Therefore, the performance of the driving transistors is guaranteed. The first connecting parts 113 and the second connecting parts 114 mainly play the role of electrical connection. Therefore, by setting the widths of the first connecting parts 113 and the second connecting parts 114 to be relatively narrow, the light transmittance can be improved. Especially, the light transmittance of the second display region AA2 can be improved, so that the photosensitive module opposite to the second display region AA2 can work better.

Figure 15:
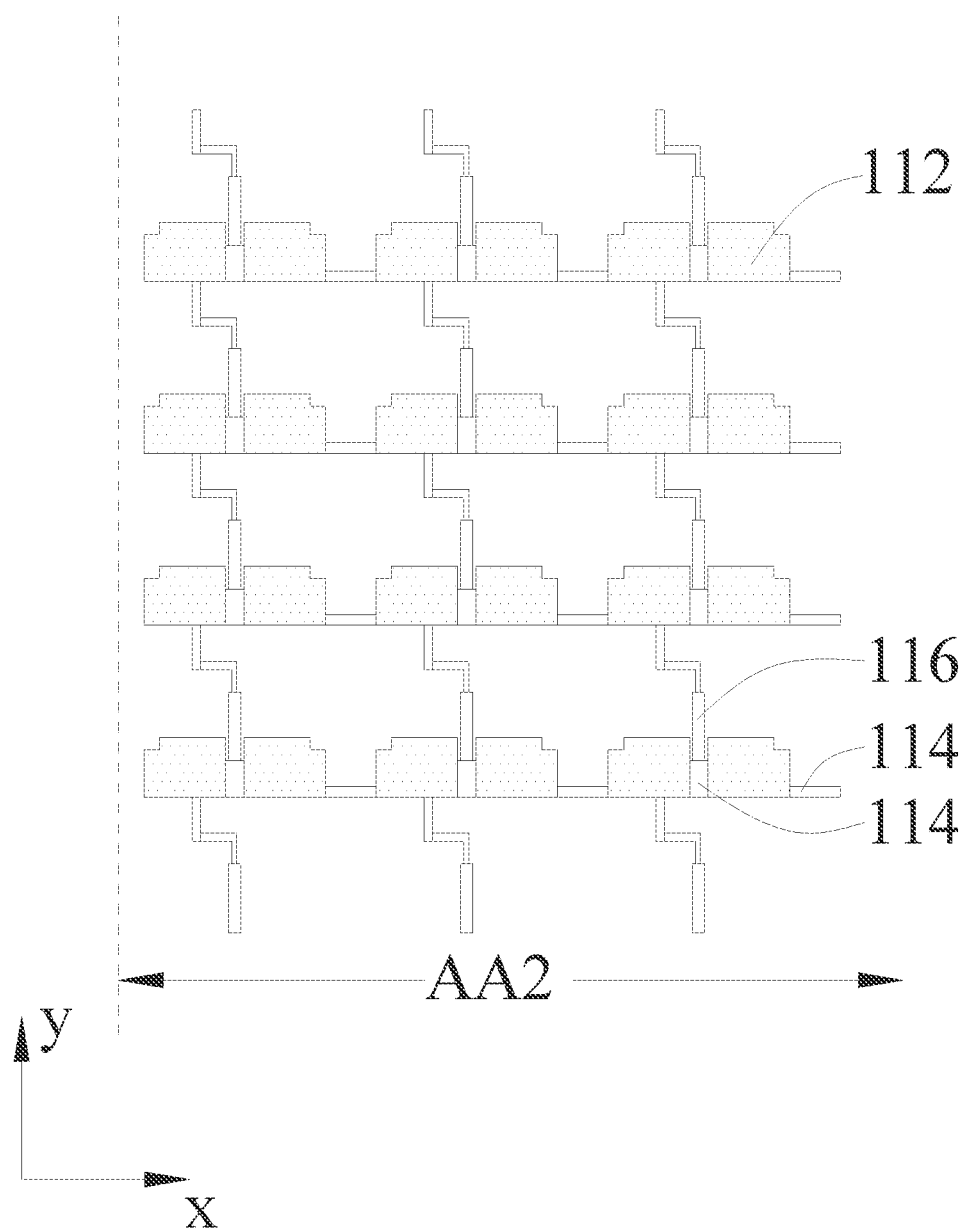
FIG. 15 is a partial schematic structural diagram of an eleventh display panel provided by an embodiment of the present application.

In a possible implementation, as shown in FIG. 15, the display panel further includes fourth connecting parts 116, and the second shielding units 112 are arranged in rows and columns. A portion of adjacent second shielding units 112 along a row direction x are connected through the second connecting parts 114, and the fourth connecting parts 116 connect the second shielding units 112 and the second connecting parts 114 along a column direction y.

In the above implementations, in the first shielding layer 11, the adjacent second shielding units 112 in the row direction x are connected through the second connecting parts 114, and the adjacent second shielding units 112 in the column direction y are connected with one second connecting part 114 through the fourth connecting part 116. Therefore, the shape of the light-transmitting region in the second display region AA2 can be further adjusted, and the regularity of the light-transmitting region can be broken, so as to improve the diffraction effect and ensure the working effect of the photosensitive module. For example, when the photosensitive module is a camera, the image quality of the camera can be improved.

Figure 16:
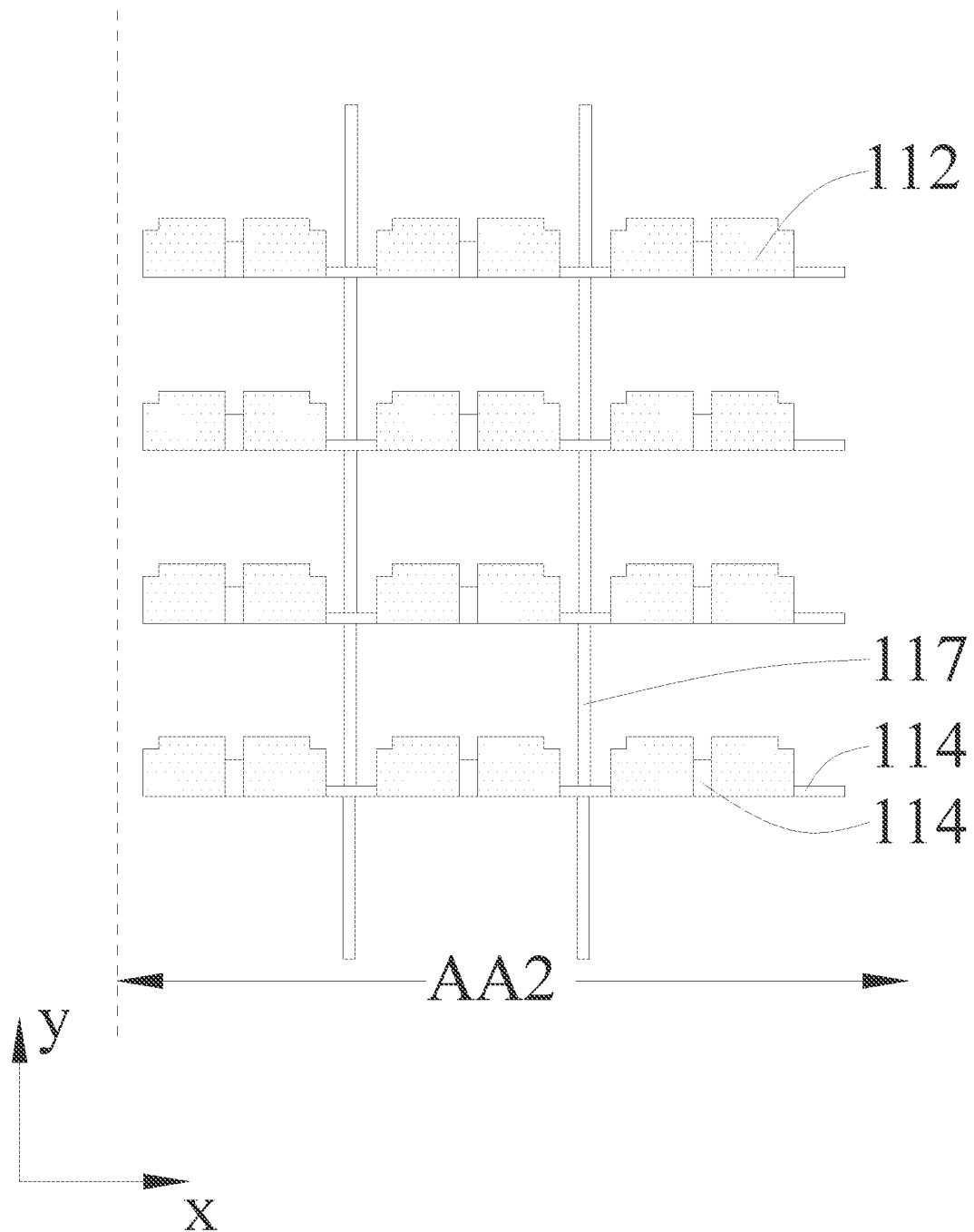
FIG. 16 is a partial schematic structural diagram of a twelfth display panel provided by an embodiment of the present application.

In a possible implementation, as shown in FIG. 16, the display panel further includes fifth connecting parts 117, and the second shielding units 112 are arranged in rows and columns. A portion of adjacent second shielding units 112 along a row direction x are electrically connected through the second connecting parts 114, and a portion of adjacent second connecting parts 114 along a column direction y are connected through the fifth connecting parts 117.

In the above implementations, the adjacent second shielding units 112 along the row direction x are electrically connected through the second connecting parts 114, and the adjacent second connecting parts 114 along the column direction y are connected through the fifth connecting parts 117. Therefore, the shape of the light-transmitting region in the second display region AA2 can be further adjusted, and the regularity of the light-transmitting region can be broken, so as to improve the diffraction effect and ensure the working effect of the photosensitive module. For example, when the photosensitive module is a camera, the image quality of the camera can be improved.

Figure 17:
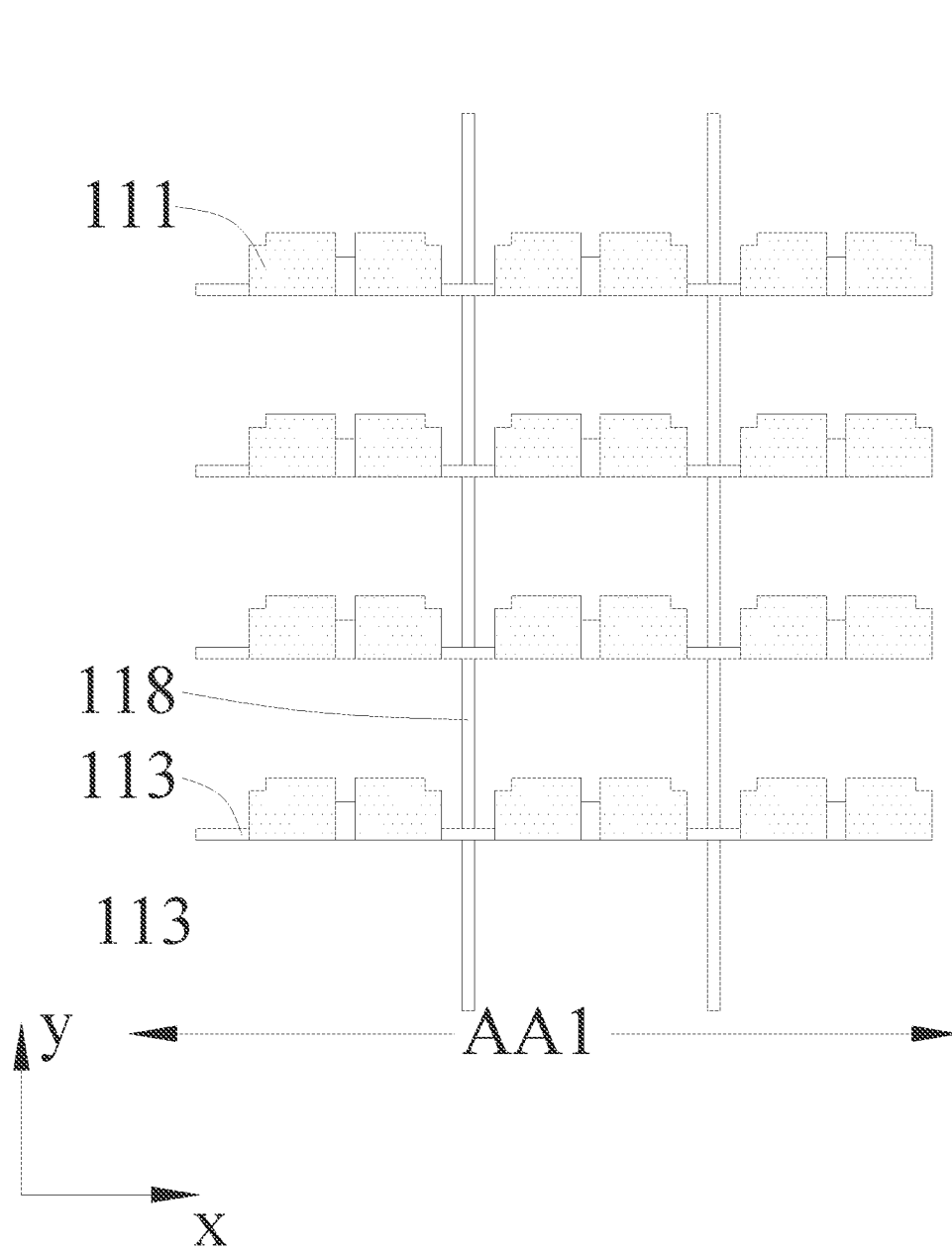
FIG. 17 is a partial schematic structural diagram of a thirteenth display panel provided by an embodiment of the present application.

In a possible implementation, as shown in FIG. 17, the display panel further includes sixth connecting parts 118, and the first shielding units 111 are arranged in rows and columns. A portion of adjacent first shielding units 111 along a row direction x are electrically connected through the first connecting parts 113, and a portion of adjacent first shielding units 111 along a column direction y are connected through the sixth connecting parts 118.

Figure 18:
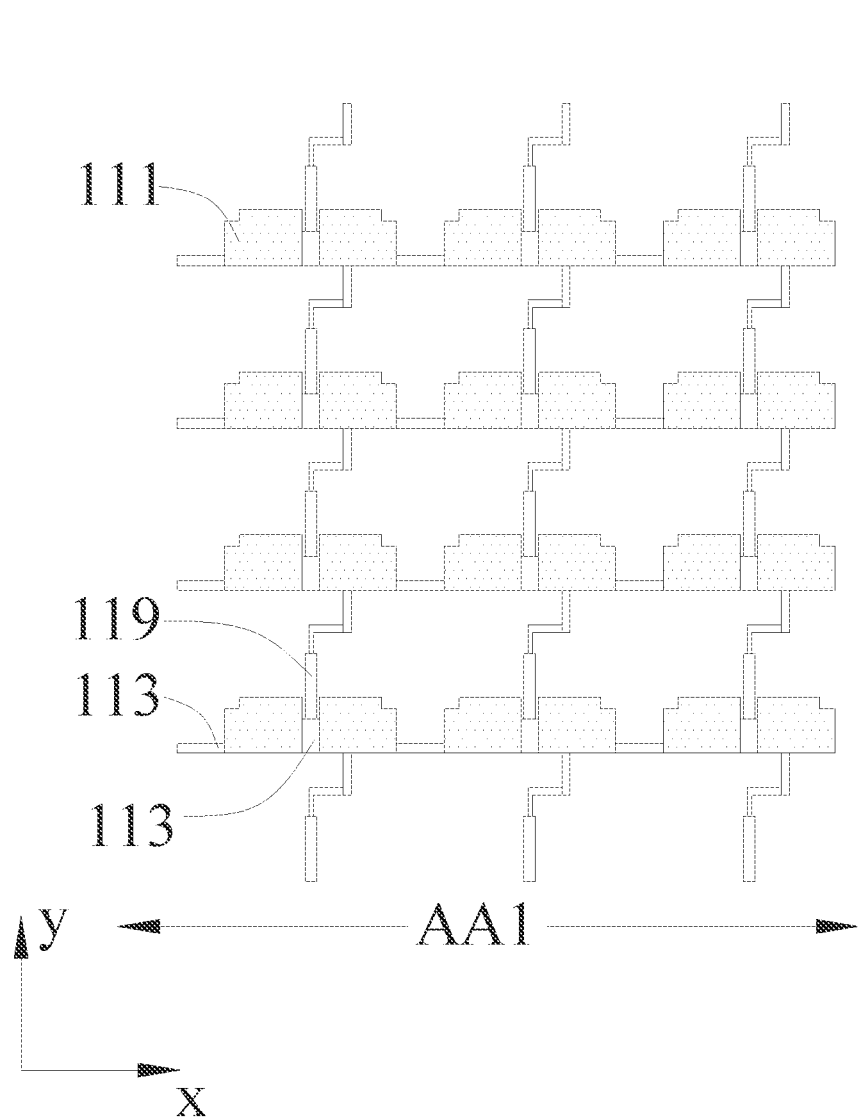
FIG. 18 is a partial schematic structural diagram of a fourteenth display panel provided by an embodiment of the present application.

In a possible implementation, as shown in FIG. 18, the display panel further includes seventh connecting parts 119, and the first shielding units 111 are arranged in rows and columns. A portion of adjacent first shielding units 111 along a row direction x are electrically connected through the first connecting parts 113, and the seventh connecting parts 119 connect the first shielding units 111 and the first connecting parts 113 along a column direction y.

Figure 19:
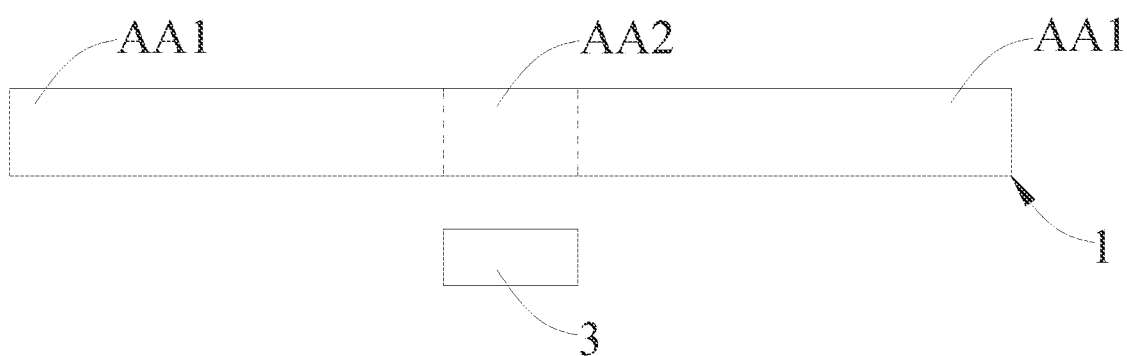
FIG. 19 is a schematic structural diagram of a display apparatus provided by an embodiment of the present application.

As shown in FIG. 19, the present application also provides a display apparatus 2, including any display panel 1 provided in the present application. The display apparatus 2 provided in the present application further includes a photosensitive module 3 disposed on a side of the display panel 1 away from a display surface and opposite to the second display region AA2. The photosensitive module 3 includes a fingerprint identification module or a camera module.

The display apparatus 2 may be a mobile terminal such as a mobile phone or a tablet, or may be a device such as a display device or a TV, which is not particularly limited in the present application. The first shielding layer in the display panel 1 of the display apparatus 2 can effectively prevent the driving transistors T from being interfered by the electric field in the substrate 10, such that the display effect of the display panel 1 may be improved and the occurrence of poor display may be prevented. Further, in the second display region AA2, only a portion of the adjacent second shielding units 112 are connected by the second connecting parts 114, and a portion of the adjacent second shielding units 112 are not provided with the second connecting parts 114, so that the influence of the second connecting parts 114 on the light transmittance of the second display region AA2 may be reduced. Therefore, the light transmittance of the second display region AA2 may be improved, and the photosensitive module 3 opposite to the second display region AA2 can work better.

The above embodiments of the present application do not exhaustively describe all the details and do not limit the present application to only the specific embodiments described. Obviously, many modifications and variations can be made based on the above description. These embodiments are selected and specifically described in the description to better explain the principles and practical applications of the present application, so that those skilled in the art can make good use of the present application and make modifications based on the present application. The present application is limited only by the claims, along with their full scope and equivalents.

What is claimed is:

1. A display panel comprising a first display region and a second display region, wherein the display panel comprises:
    a substrate;
    a first shielding layer located on a side of the substrate, wherein the first shielding layer comprises a plurality of first shielding units located in the first display region and a plurality of second shielding units located in the second display region, at least a portion of adjacent first shielding units are connected through first connecting parts, and a portion of adjacent second shielding units are connected through second connecting parts;
    a driving circuit layer located on a side of the first shielding layer away from the substrate, wherein the driving circuit layer comprises a plurality of driving circuits, and each driving circuit comprises a driving transistor;
    wherein first shielding units of the plurality of first shielding units and second shielding units of the plurality of second shielding units are in one-to-one correspondence with driving transistors, and orthographic projections of channel regions of active layers of the driving transistors on the first shielding layer are located in the first shielding units and the second shielding units.

2. The display panel according to claim 1, wherein each of the first shielding units is connected with N first connecting parts, and at least one of the second shielding units is connected with n second connecting parts, wherein n<N.

3. The display panel according to claim 2, wherein a distribution density of the second connecting parts gradually decreases from a side close to the first display region to a side away from the first display region.

4. The display panel according to claim 2, wherein the first shielding units are arranged in rows and columns, adjacent first shielding units along a row direction are electrically connected through the first connecting parts, and adjacent first shielding units along a column direction are electrically connected through the first connecting parts; the second shielding units are arranged in rows and columns, a portion of adjacent second shielding units along a row direction are connected through the second connecting parts, and a portion of adjacent second shielding units in a column direction are electrically connected through the second connecting parts.

5. The display panel according to claim 2, wherein the second shielding units are arranged in rows and columns, and adjacent second shielding units in each row are electrically connected through the second connecting parts, and wherein the second display region comprises a plurality of first preset columns and a plurality of second preset columns, adjacent second shielding units in the first preset columns are electrically connected through the second connecting parts, and adjacent second shielding units in the second preset columns have first preset gaps.

6. The display panel according to claim 5, wherein the second display region comprises a first preset column group containing at least one of the first preset columns and a second preset column group containing at least one of the second preset columns, and the first preset column group and the second preset column group are alternately arranged.

7. The display panel according to claim 2, wherein the second shielding units are arranged in rows and columns, the second display region comprises a plurality of first preset rows and a plurality of second preset rows, at least a portion of adjacent second shielding units in the first preset rows have second preset gaps, and adjacent second shielding units in the second preset rows are electrically connected through the second connecting parts; the second display region comprises a plurality of first preset columns and a plurality of second preset columns, adjacent second shielding units in the first preset columns are electrically connected through the second connecting parts, and adjacent second shielding units in the second preset columns have first preset gaps.

8. The display panel according to claim 7, wherein the second display region comprises a first preset row group containing at least one of the first preset rows and a second preset row group containing at least one of the second preset rows, and the first preset row group and the second preset row group are alternately arranged;
    the second display region comprises a first preset column group containing at least one of the first preset columns and a second preset column group containing at least one of the second preset columns, and the first preset column group and the second preset column group are alternately arranged.

9. The display panel according to claim 6, wherein the second display region further comprises a plurality of third preset columns, a portion of adjacent second shielding units in the third preset columns are electrically connected through the second connecting parts, and a portion of adjacent second shielding units in the third preset columns have first preset gaps;
    the second display region further comprises a third preset column group containing at least one of the third preset columns, and the first preset column group, the second preset column group and the third preset column group are arranged in sequence.

10. The display panel according to claim 1, wherein each of the first shielding units is connected with N first connecting parts, and at least one of the second shielding units is connected with n second connecting parts, wherein n=N.

11. The display panel according to claim 1, further comprising an insulating layer formed between the first shielding layer and the driving circuit layer.

12. The display panel according to claim 1, wherein material of the first shielding layer comprises molybdenum, or
    material of the first shielding units comprises molybdenum; each of the second shielding units comprises a silicon material layer, a silicon dioxide material layer and a molybdenum metal layer sequentially arranged along a direction away from the substrate.

13. The display panel according to claim 1, wherein the first shielding units are connected to a first fixed electric potential, and the second shielding units are connected to a second fixed electric potential.

14. The display panel according to claim 13, wherein the first fixed electric potential and the second fixed electric potential are a same electric potential, and at least a portion of adjacent first shielding units and second shielding units are connected through third connecting parts.

15. The display panel according to claim 13, wherein each of the first shielding units and each of the second shielding units are insulated from each other, the first fixed electric potential is greater than the second fixed electric potential, and wherein the driving circuit layer further comprises a first power supply line and a reset signal line, the first power supply line provides the first fixed electric potential, and the reset signal line provides the second fixed electric potential.

16. The display panel according to claim 1, wherein the driving circuit layer comprises scan lines and an active layer and a gate layer of the driving transistors; at least a portion of the scan lines are located in the gate layer, a portion of the first connecting parts comprise first subsections and second subsections located between the first subsections and the first shielding units, and line widths of the first subsections are smaller than line widths of the second subsections.

17. The display panel according to claim 16, wherein a portion of the second connecting parts comprise third subsections and fourth subsections, line widths of the third subsections are smaller than line widths of the fourth subsections, and the fourth subsections and the second subsections overlap with the scan lines in a direction perpendicular to the substrate.

18. The display panel according to claim 1, wherein line widths of the first connecting parts are smaller than minimum widths of the first shielding units along a column direction, and line widths of the second connecting parts are smaller than minimum widths of the second shielding units along the column direction.

19. The display panel according to claim 1, wherein the display panel further comprises fourth connecting parts, the second shielding units are arranged in rows and columns, each of the second connecting parts connects two of the second shielding units along a row direction, and the fourth connecting parts connect the second shielding units and the second connecting parts along a column direction.

20. A display apparatus comprising a display panel having a first display region and a second display region, wherein the display panel comprises:
  a substrate;
  a first shielding layer located on a side of the substrate, wherein the first shielding layer comprises a plurality of first shielding units located in the first display region and a plurality of second shielding units located in the second display region, at least a portion of adjacent first shielding units are connected through first connecting parts, and a portion of adjacent second shielding units are connected through second connecting parts;
  a driving circuit layer located on a side of the first shielding layer away from the substrate, wherein the driving circuit layer comprises a plurality of driving circuits, and each driving circuit comprises a driving transistor;
  wherein first shielding units of the plurality of first shielding units and second shielding units of the plurality of second shielding units are in one-to-one correspondence with driving transistors, and orthographic projections of channel regions of active layers of the driving transistors on the first shielding layer are located in the first shielding units and the second shielding units.

* * * * *